United States Patent [19]
Wristers et al.

[11] Patent Number: 5,674,788
[45] Date of Patent: Oct. 7, 1997

[54] METHOD OF FORMING HIGH PRESSURE SILICON OXYNITRIDE GATE DIELECTRICS

[75] Inventors: Dirk J. Wristers; H. Jim Fulford; Dim Lee Kwong, all of Austin, Tex.

[73] Assignee: Advanced Micro Devices, Inc., Sunnyvale, Calif.

[21] Appl. No.: 470,321

[22] Filed: Jun. 6, 1995

[51] Int. Cl.$^6$ .................................................. H01L 21/31
[52] U.S. Cl. ..................... 437/239; 437/242; 437/240; 437/42; 437/983; 148/DIG. 118; 257/410
[58] Field of Search ..................... 437/40, 41, 239, 437/242, 983, 238, 240, 42; 148/DIG. 118; 257/410

[56] References Cited

U.S. PATENT DOCUMENTS

| | | | |
|---|---|---|---|
| 4,282,270 | 8/1981 | Nozake et al. | 437/242 |
| 5,397,720 | 3/1995 | Kwong et al. | |
| 5,407,870 | 4/1995 | Okada et al. | |
| 5,420,077 | 5/1995 | Saito et al. | |
| 5,464,792 | 11/1995 | Tseng et al. | |

FOREIGN PATENT DOCUMENTS 57-10242  1/1982  Japan.

OTHER PUBLICATIONS

Hisayo Sasaki Momose et al: "Electrical Characteristics of Rapid Thermal Nitrided-Oxide Gate N-and P-Mosfet's With Less Than 1 Atom% Nitrogen Concentration", IEEE transactions on electron Devices, vol. 41, No. 4, Apr. 1, 1994, pp. 546-552.

Yoshio Okada et al: "Oxinitride Gate Electrics Prepared By Rapid Thermal Processing Using Mixtures of Nitrous Oxide and Oxygen", Applied Physics Letters, vol. 61, No. 26, Dec. 28, 1992, pp. 3163-3165.

Hyunsang Hwang et al: "Electrical Characteristics of Ultrathin Oxynitride Gate Dielectric Prepared by Rapid Thermal Oxidation of S1 in N20", Applied Physics Letters, vol. 57, No. 10, Sep. 3, 1990, p. 1010.

Ito et al., "Advantages of Thermal Nitride and Nitroxide Gate Films in VLSI Process," IEEE Transactions on Electron Devices, vol. ED-29 No. 4, (Apr., 1982), pp. 498-502.

Woerlee et al., "$N_2O$ Nitrided Gate Dielectric Technology for 0.25 μm CMOS," Int. Symp. VLSI Tech., (1993), pp. 105-108.

Bhat et al., "Electrical Properties and Reliability of MOSFET's with Rapid Thermal NO-Nitrided $SiO_2$ Gate Dielectrics," IEEE Transactions on Electron Devices, vol. 42 No. 5, (May, 1995), pp. 907-914.

Hori et al., "Ultra-Thin Re-Oxidized Nitrided-Oxides Prepared By Rapid Thermal Processing," IEDM Tech. Digest, pp. 570-573.

Wolf, S. et al, "Silicon Processing for the VLSI Era; vol. 1, Process Technology," Lattice Press, 1986, pp. 216-218.

Primary Examiner—George Fourson
Attorney, Agent, or Firm—Kevin L. Daffer; Conley, Rose & Tayon

[57] ABSTRACT

A silicon oxynitride (oxynitride) dielectric layer is presented using a process in which nitrogen is incorporated into the dielectric as it is grown upon a silicon substrate. The oxynitride layer is grown at elevated temperature and pressure in an ambient containing $N_2O$ and/or NO. A MOS gate dielectric is advantageously formed from the oxynitride dielectric layer with a sufficient nitrogen concentration near the interface between a boron-doped polysilicon gate electrode and the gate dielectric as to prevent boron atoms from penetrating into the gate dielectric. Further, the oxynitride layer contains a sufficient nitrogen concentration near the interface between the gate dielectric and a silicon substrate as to reduce the number of high-energy electrons injected into the gate dielectric which become trapped in the gate dielectric. Nitrogen atoms in the gate dielectric near the interface between the boron-doped polysilicon gate electrode and the gate dielectric physically block boron atoms, preventing them from penetrating into the gate dielectric. Nitrogen atoms and silicon atoms form strong Si—N bonds at the interface between the gate dielectric and the silicon substrate, helping ensure injected electrons are not easily trapped in the oxynitride dielectric layer.

18 Claims, 6 Drawing Sheets

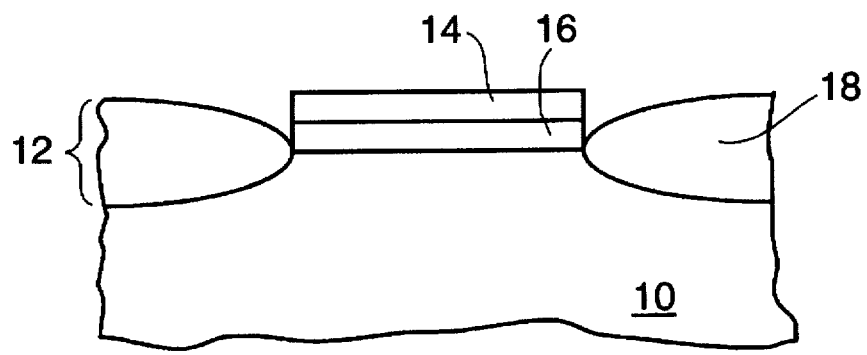
FIG. 1
FIG. 2
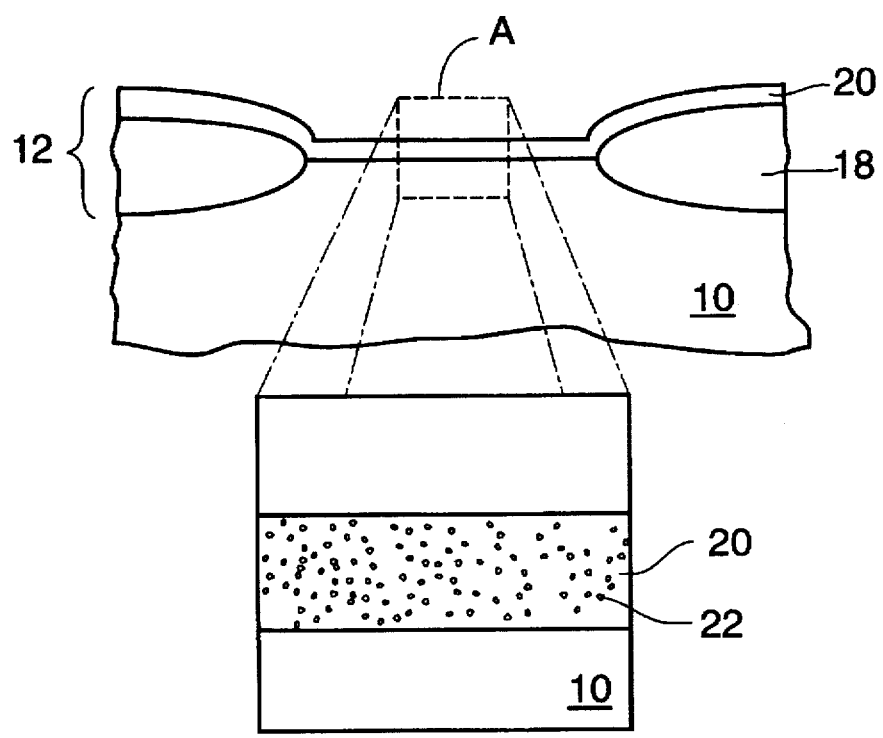
FIG. 3
FIG. 4

METHOD OF FORMING HIGH PRESSURE SILICON OXYNITRIDE GATE DIELECTRICS

BACKGROUND OF THE INVENTION

1. Field of the Invention

This invention relates to the fabrication of an integrated circuit and more particularly the fabrication of metal oxide semiconductor (MOS) devices with p+ polycrystalline silicon (polysilicon) gate electrodes.

2. Description of the Relevant Art

A metal oxide semiconductor (MOS) transistor is a majority-carrier device in which current flow in a conducting channel formed between a source region and a drain region is modulated by an electrical potential (i.e., voltage) formed between a gate electrode and the substrate. A voltage formed between the gate electrode and the substrate which increases the number of majority carriers drawn into the channel region directly under the gate electrode results in an increase in the conductivity of the channel region. In order to draw majority carriers into the channel region, the voltage formed between the gate electrode and the substrate must exceed a certain threshold voltage level. This threshold voltage level depends on a number of factors including the gate electrode material, the gate insulator material, the thickness of the gate insulator, and the doping concentration in the channel region.

The threshold voltage levels of MOS transistors employed in a digital integrated circuit influence many characteristics of the circuit including maximum operating speed, power dissipation, and noise immunity. Lowering the threshold voltage level of an MOS transistor increases its current-driving capability. Employing MOS transistors with increased current-driving capability can increase the speed of logic level transitions. Lower threshold voltage levels are thus desirable for high-speed digital circuits.

As the threshold voltage level of an MOS transistor is lowered, however, the amount of subthreshold current flowing through the transistor may also increase. Subthreshold current is the current flowing from the source to the drain when the voltage between the gate electrode and the substrate is less than the threshold voltage level. This may be an important consideration in applications requiring low power dissipation and in large circuits with many MOS transistors. Noise immunities of circuits employing MOS transistors typically decrease when threshold voltage levels are reduced. This problem is exacerbated in circuits operable in high noise environments. Thus threshold voltage levels are often determined with consideration given to operating speed, power dissipation, and noise immunity. In general, threshold voltage levels of MOS transistors are lowered as much as the design application will allow.

In complementary MOS (CMOS) circuits, n-channel MOS transistors typically sink load current and p-channel MOS transistors typically source current to the load. Since it is desirable to be able to both charge and discharge capacitive loads quickly, the threshold voltage levels of n-channel and p-channel MOS transistors are often reduced as much as possible.

As mentioned above, the threshold voltage level of an MOS transistor depends on a number of factors including the gate electrode material, the gate insulator material, the thickness of the gate insulator, and the doping concentration in the channel region. In order to reduce the threshold voltage level of an MOS transistor, a gate electrode material may be chosen such that the value of the work function of the gate electrode material is as close to the value of the work function of the substrate as possible. The gate electrode material and thickness of the underlying gate insulator may be selected such that the electrical capacitance between the gate electrode and the substrate is as high as possible.

Heavily doped polysilicon is typically used as a gate electrode in common self-aligned MOS processes. It adheres well to gate oxides (i.e., gate insulators), and is able to withstand the environments created during subsequent self-aligned processing steps. The work-function of n+ polysilicon is ideal for n-channel MOS transistors of CMOS circuits. Using n+ polysilicon gate electrodes, n-channel MOS transistors may be produced with threshold voltages of less than +0.7 volts for easily producible values of channel doping concentration levels and gate oxide thickness.

When the same n+ polysilicon is used for the gate electrodes of p-channel MOS transistors, however, the magnitudes of the resulting threshold voltage levels are well above 0.7 volts. In CMOS circuits, such p-channel devices would have less current driving ability than their n-channel complements. In order to reduce the magnitudes of the threshold voltage levels of p-channel MOS transistors, shallow implants of boron are commonly placed in the channel regions just under the gate electrodes of p-channel MOS transistors. The slightly p-type surfaces of the channel regions result in threshold voltage levels of reduced magnitude. However, such buried-channel devices are more susceptible to the punchthrough effect. As will be described below, the susceptibility of buried-channel devices to the punchthrough effect increases as device dimensions shrink.

Punchthrough occurs when the voltage formed between the gate electrode and the substrate is less than the threshold voltage level, and the reverse bias voltage on the drain region is large enough that the drain depletion region meets the source depletion region in the subsurface region below the gate electrode. When punchthrough occurs, majority carriers flow from the source region to the drain region, creating a subsurface flow of (subthreshold) current. Small MOS transistors with short channel lengths between the source and drain regions are particularly susceptible to the punchthrough effect. The use of boron to adjust threshold voltage levels of p-channel MOS transistors becomes less feasible as thinner gate insulators are used, due to the fact that larger doses of boron are required. As the active channel region is forced deeper into the substrate, the punchthrough problem worsens.

Another way to lower the magnitudes of threshold voltage levels of p-channel MOS devices is to use p+ polysilicon for the gate electrodes of p-channel devices. P-type boron may be introduced into the polysilicon of the gate electrode at the same time the source and drain regions of a p-channel device are formed. A decrease in the difference in the work functions of the p+ polysilicon gates and the substrates results in a decrease in the magnitudes of the threshold voltage levels of p-channel MOS devices with p+ polysilicon gates. The magnitudes of threshold voltage levels of p-channel MOS transistors with p+ polysilicon gates are typically 0.7 volts or less (without buried channel implants).

A problem is encountered with the use of p+ polysilicon gate electrodes when thin oxide layers are used as gate insulators, however. Unlike the n-type phosphorus atoms used to dope the n+ polysilicon gate electrodes of the n-channel devices, p-type boron atoms used to dope the polysilicon gate electrodes of the p-channel devices are highly mobile and tend to penetrate into and even through thin gate oxide layers. Temperatures associated with post-implant annealing operations greatly increase the segregation and diffusion of boron atoms penetrating into and through thin gate oxides. If enough boron atoms penetrate into or through the gate oxide layer of a p-channel device, the threshold voltage level magnitude of the resulting device may be unduly lowered. Threshold voltage level lowering may also occur non-uniformly across the wafer, dependent upon variability in oxide thickness and boron concentration skews within the diffusion chamber or implant scan.

As device geometries shrink in order to improve circuit performance and increase packing density, MOS devices begin to display many second-order effects including the short-channel effect and the narrow-channel effect. Small MOS devices are also more vulnerable to the punchthrough effect. Since the built-in electrical potentials of semiconductors do not scale with geometries, power supply voltage levels do not decrease proportionally. The resulting high electric field strengths produce an increased vulnerability to hot-carrier effects and the trapping of high-energy charge carriers within gate insulators.

In an effort to minimize boron segregation and redistribution through a gate oxide and into the channel region of a p-channel MOS device, many researchers point to the advantages of using nitrogen atoms as a barrier material. Nitridation of the gate oxide after the oxide is formed seems to bear encouraging results. Thermally-nitrided oxides are typically formed by first growing a gate oxide layer, and then performing a thermal nitridation procedure in a nitrogen-bearing ambient. Thermally-nitrided oxides have been shown to form high quality MOS gate insulating layers. Thermally-nitrided oxides have a higher dielectric constant than oxides and are more immune to hot-carrier effects. See, Ito et al., "Advantages of Thermal Nitride and Nitroxide Gate Films in VLSI Process," IEEE Transactions on Electron Devices, Vol. ED-29 No. 4, April, 1982, pp. 498–502, and Woerlee et al., "$N_2O$ Nitrided Gate Dielectric Technology for 0.25 μm CMOS," Int. Symp. VLSI Tech., 1993, pp. 105–108.

The improvement in hot-carrier reliability of thermally-nitrided oxides is mainly attributed to the presence of nitrogen at the interface between a silicon substrate and a gate oxide (i.e., the Si/SiO$_2$ interface). The presence of nitrogen at the Si/SiO$_2$ interface reduces interface state generation by relieving strain at the Si/SiO$_2$ interface, and also reduces charge carrier trapping by forming strong Si—N bonds in place of weaker Si—H and strained Si—O bonds. See, Bhat et al., "Electrical Properties and Reliability of MOSFET's with Rapid Thermal NO-Nitrided SiO$_2$ Gate Dielectrics," IEEE Transactions on Electron Devices, Vol. 42 No. 5, May, 1995, pp. 907–914.

Incorporation of nitrogen into a pre-existing oxide (i.e., thermal nitridation) generally uses two types of source gases: 1) those comprising ammonia (NH$_3$), and 2) those comprising nitrous oxide (N$_2$O) and/or nitric oxide (NO). Thermally-nitrided oxides having high nitrogen concentrations at the surface and at the Si/SiO$_2$ interface may be formed using NH$_3$. See, Hori et al., "Ultra-Thin Re-Oxidized Nitrided-Oxides Prepared By Rapid Thermal Processing," IEDM Tech. Digest, 1987, pp. 570–573. A high nitrogen concentration at the surface of a such a thermally-nitrided oxide may provide a diffusion barrier to boron atoms, and a high concentration of nitrogen atoms at the Si/SiO$_2$ interface may increase the resistance of the dielectric to hot-carrier effects as described above.

Thermal nitridation using NH$_3$ cannot be accomplished without unavoidably introducing hydrogen atoms into the gate dielectric, however. It is well known that hydrogen atoms easily diffuse to the Si/SiO$_2$ interface and form weak Si—H bonds. These weak Si—H bonds are readily broken by hot electrons injected into the gate dielectric, forming empty electron states (or traps) which may be filled by the injected electrons. Trapped electrons contribute to the fixed oxide charge of the dielectric, causing a shift in the threshold voltage level. The number of trapped electrons increases with time, degrading device performance until device performance becomes unacceptable.

The deleterious effects of hydrogen incorporated into thermally-nitrided oxides produced using NH$_3$ may be reduced by re-oxidizing the thermally-nitrided oxides at high temperatures in an oxygen ambient. In this process, however, the nitrogen concentration near the surface of the thermally-nitrided oxides is reduced, while the nitrogen concentration near the Si—SiO$_2$ interface does not change appreciably. See, Hori et al., "Ultra-Thin Re-Oxidized Nitrided-Oxides Prepared By Rapid Thermal Processing," IEDM Tech. Digest, 1987, pp. 570–573. Unfortunately, the resulting nitrogen concentrations near the surface of re-oxidized nitrided oxides may not be sufficient to block boron penetration into the gate dielectrics. In addition, the required multiple high-temperature cycles (i.e., oxidation and nitridation) are undesirable for submicron MOS device fabrication processes.

It is postulated that processes employing thermal nitridation of pre-existing oxides or growth of oxynitrides using N$_2$O and/or NO at pressures of 1.0 atmosphere and below cannot achieve a sufficient nitrogen concentration at an upper surface (near an interface between a boron-doped polysilicon gate electrode and the gate dielectric) as to prevent boron atoms in the polysilicon gate electrode from penetrating into the gate dielectric.

It would thus be advantageous to have a method of forming a silicon oxynitride gate dielectric for p-type MOS devices at a pressure greater than 1.0 atmospheres which: 1) does not use a hydrogen-bearing source gas such as NH$_3$, 2) results in a dielectric with a sufficient concentration of nitrogen atoms at an upper surface (near an interface between a boron-doped polysilicon gate electrode and the gate dielectric) as to prevent boron atoms in the polysilicon gate electrode from penetrating into the gate dielectric, 3) results in a dielectric with a sufficient concentration of nitrogen atoms at a lower surface (near an interface between the gate dielectric and a silicon substrate) as to reduce the number of high-energy electrons (i.e., hot electrons) injected into and thereafter trapped within the gate dielectric, and 4) avoids the added steps and high-temperature cycles associated with the thermal nitridation of a pre-existing oxide.

SUMMARY OF THE INVENTION

The problems outlined above are in large part solved by a method of forming high pressure silicon oxynitride (oxynitride) gate dielectrics for metal oxide semiconductor (MOS) devices with p+ polycrystalline silicon (polysilicon) gate electrodes. Using a high pressure thermal growth process, the method of the present invention produces an oxynitride dielectric layer in an ambient including N$_2$O and/or NO. An MOS gate dielectric, positioned between a boron-doped polysilicon gate electrode and a silicon substrate, is advantageously formed from such an oxynitride dielectric layer.

An MOS gate dielectric formed from an oxynitride dielectric layer has the following advantages. First, the oxynitride dielectric layer has a sufficient concentration of nitrogen atoms near the interface between the boron-doped polysilicon gate electrode and the gate dielectric as to prevent boron atoms in the boron-doped polysilicon gate electrode from penetrating into the gate dielectric. Second, the oxynitride dielectric layer has a sufficient concentration of nitrogen atoms near the interface between the gate dielectric and the silicon substrate as to reduce the number of hot electrons injected into and thereafter trapped within the gate. Nitrogen atoms at the polysilicon gate-oxynitride dielectric interface physically block boron atoms, preventing boron atoms in the boron-doped polysilicon gate electrode from penetrating into the gate dielectric. Nitrogen atoms present at the oxynitride dielectric-substrate interface form strong Si—N bonds, helping ensure injected hot electrons are not easily trapped in the gate dielectric.

Processes employing thermal nitridation of pre-existing oxides or growth of oxynitrides using $N_2O$ and/or NO at pressures of 1.0 atmosphere and below cannot achieve a sufficient nitrogen concentration at an upper surface (near an interface between a boron-doped polysilicon gate electrode and the gate dielectric) as to prevent boron atoms in the polysilicon gate electrode from penetrating into the gate dielectric. It is postulated that the concentration of nitrogen atoms at the upper surface of an oxynitride gate dielectric must be at least $1.0 \times 10^{21}$ atoms/cm$^3$ in order to prevent boron atoms in the polysilicon gate electrode from penetrating into the gate dielectric.

Broadly speaking, the present oxynitride layer may be thermally grown by inserting a silicon substrate into a chamber containing a nitrogen-bearing gas such as $N_2O$, NO, or a combination of both $N_2O$ and NO. The temperature and pressure within the chamber may then be increased. An oxynitride layer may thus be thermally grown at temperatures between 650° C. and 900° C. and at pressures from $2.0 \times 10^5$ Pa to $25.0 \times 10^5$ Pa (about 2.0 to 25.0 atmospheres). The resulting oxynitride layer may be patterned to form an MOS gate dielectric. The concentration of nitrogen atoms in the gate dielectric formed from the oxynitride layer may be fairly constant, and sufficient to achieve the benefits described above.

BRIEF DESCRIPTION OF THE DRAWINGS

Other objects and advantages of the invention will become apparent upon reading the following detailed description and upon reference to the accompanying drawings in which:

FIG. 1 is a partial cross-sectional view of a silicon substrate having a silicon nitride layer deposited over a pad oxide layer, all of which are formed over an active device region between field oxide layer openings on a frontside surface of the silicon substrate;

FIG. 2 shows the silicon substrate of FIG. 1 after the silicon nitride and pad oxide layers have been removed;

FIG. 3 shows the silicon substrate of FIG. 2 after a silicon oxynitride (oxynitride) layer has been thermally grown over the frontside surface;

FIG. 4 is a detailed view along plane A of FIG. 3, illustrative of a substantially constant concentration of nitrogen atoms in the oxynitride layer;

Figure 5:
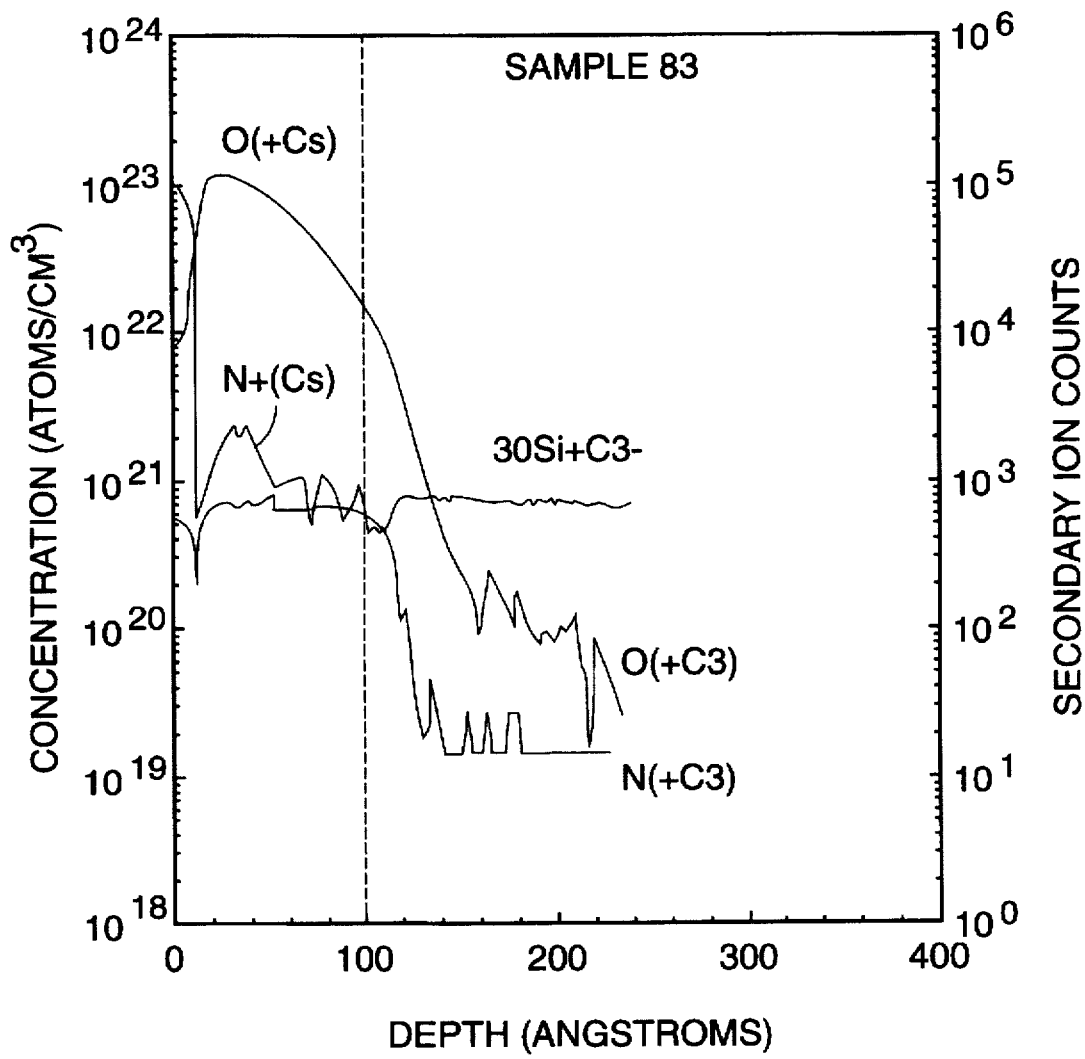
FIG. 5 is a graph of atomic concentrations of oxygen (O), nitrogen (N), and silicon (Si) versus depth along a profile of a first oxynitride layer grown according to the method of the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIGS. 1–14 will be used to describe how a p-type lightly doped drain (LDD) MOS transistor with an oxynitride gate dielectric may be formed on and in a frontside surface of a silicon substrate. In FIG. 1, active device and field regions have been defined. A silicon nitride layer 14 on a pad oxide layer 16 remain over an active device region of a frontside surface 12 of a silicon substrate 10. A field oxide layer 18 has been thermally grown over field regions absent oxygen-impervious silicon nitride layer 14 according to well-defined local oxidation of silicon (LOCOS) techniques.

FIG. 2 shows silicon substrate 10 after silicon nitride layer 14 and pad oxide layer 16 have been removed from frontside surface 12. After field oxide layer 18 has been grown, silicon nitride layer 14 and pad oxide layer 16 are removed using, for example, a dry etch process or a wet chemical etch of known origin. A sacrificial oxide layer (not shown) may be grown and etched away from frontside surface 12 at this time, depending upon process constraints. The purpose of such a sacrificial oxide layer is to remove any residual nitride.

FIG. 3 shows silicon substrate 10 after a silicon oxynitride (oxynitride) layer 20 has been thermally grown over frontside surface 12. Oxynitride layer 20 is grown under elevated temperature and pressure in a nitrogen-bearing ambient.

Oxynitride layer 20 is thermally grown by placing silicon substrate 10 on-edge in a wafer boat, and inserting the wafer boat into an oxidation furnace set into a high-pressure chamber. The oxidation furnace contains a nitrogen-bearing gas such as $N_2O$, NO, or a combination of both $N_2O$ and NO. Oxynitride layer 20 may be thermally grown at temperatures between 650° C. and 900° C. and at pressures from $2.0 \times 10^5$ Pa to $10.0 \times 10^5$ Pa. As shown in FIG. 4, the concentration of nitrogen atoms 22 in resulting oxynitride layer 20 is fairly uniform not only across the frontside surface, but, more importantly, throughout the cross-sectional plane (or profile) of oxynitride layer 20. It is postulated that pressure associated with the high pressure chamber makes it thermodynamically favorable for the formation of Si—N bonds in the bulk of oxynitride layer 20, as compared to just at the Si/SiO2 interface as observed for the formation of oxynitride layers at pressures of 1.0 atmosphere and below. As will be discussed hereinbelow, atomic nitrogen forms bonds with silicon and oxygen at uniform intervals within the oxynitride structure. These regular bonds help occupy diffusion avenues normally taken by subsequently introduced boron species. Advantages in having a uniform distribution of nitrogen are manyfold, some of which are to control boron diffusion and hot electron trapping therein.

FIG. 5 shows a secondary ion mass spectroscopy (SIMS) plot of atomic concentration of oxygen (O), nitrogen (N), and silicon (Si) of an oxynitride layer grown on a silicon substrate using the method of the present invention. Atomic concentrations are shown from an upper surface of the oxynitride layer (0.0 angstroms) to a depth which exceeds the thickness of the oxynitride layer (about 100 angstroms). This plot shows the concentration of oxygen atoms is highest near the surface of the oxynitride layer, decreases sharply near a lower surface of the oxynitride layer (i.e., at the dielectric-substrate interface), and continues to decrease with increasing depth into the silicon substrate. The concentration of silicon atoms in the oxynitride layer and in the silicon substrate is fairly uniform at about $7.0 \times 10^{20}$ atoms/cm$^3$. The concentration of nitrogen atoms is also fairly uniform in the oxynitride layer at about $1.0 \times 10^{21}$ atoms/cm$^3$, being slightly higher at the surface. The concentration of nitrogen atoms decreases sharply near the dielectric-substrate interface, stabilizing at a background concentration of about $1.5 \times 10^{19}$ atoms/cm3 in the silicon substrate.

Figure 6:
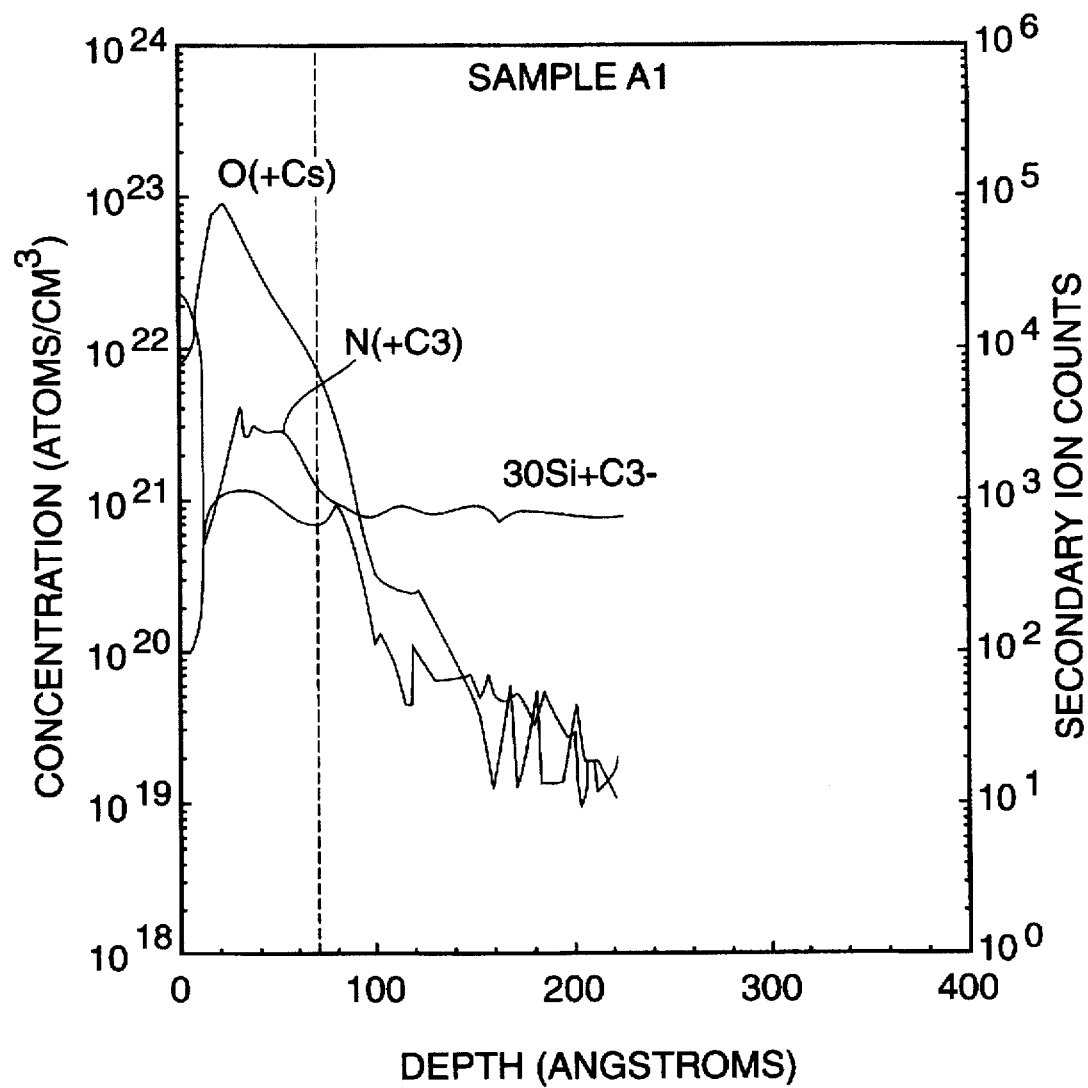
FIG. 6 is a graph of atomic concentrations of oxygen (O), nitrogen (N), and silicon (Si) versus depth along a profile of a second oxynitride layer grown according to the method of the present invention.

FIG. 6 shows a secondary ion mass spectroscopy (SIMS) plot of atomic concentration of oxygen (O), nitrogen (N), and silicon (Si) versus depth from a surface of an oxynitride layer about 70 angstroms thick grown on a silicon substrate using the method of the present invention. As in FIG. 5, the concentration of oxygen atoms is highest near the surface, decreases sharply near the dielectric-substrate interface, and continues to decrease with increasing depth into the silicon substrate. The concentration of silicon atoms in the oxynitride layer and in the silicon substrate is fairly uniform at about $1.0 \times 10^{21}$ atoms/cm$^3$. The concentration of nitrogen atoms is also fairly uniform in the oxynitride layer at about $3.0 \times 10^{21}$ atoms/cm$^3$. The concentration of nitrogen atoms decreases sharply near the dielectric-substrate interface, and continues to decrease with increasing depth into the silicon substrate.

Processes employing thermal nitridation of pre-existing oxides or growth of oxynitrides using $N_2O$ and/or NO at pressures of 1.0 atmosphere and below cannot achieve a sufficient nitrogen concentration at an upper surface (near an interface between a boron-doped polysilicon gate electrode and the gate dielectric) as to prevent boron atoms in the polysilicon gate electrode from penetrating into the gate dielectric. It is postulated that the concentration of nitrogen atoms at the upper surface of an oxynitride gate dielectric must be at least $1.0 \times 10^{21}$ atoms/cm$^3$ in order to prevent boron atoms in the polysilicon gate electrode from penetrating into the gate dielectric.

Figure 7:
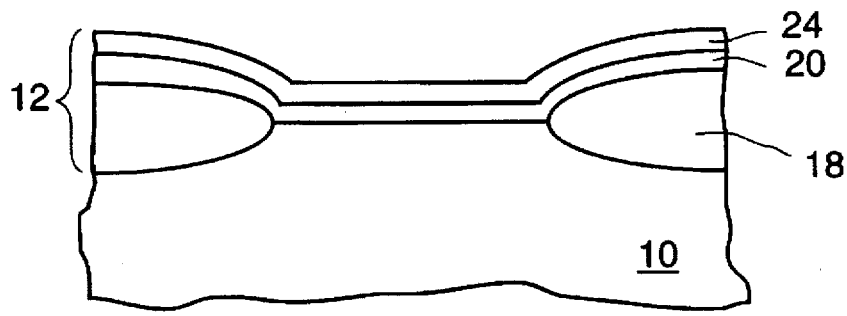
FIG. 7 shows the silicon substrate of FIG. 3 after a polysilicon layer has been deposited over the oxynitride layer.

FIG. 7 shows silicon substrate 10 after a polysilicon layer 24 has been deposited over oxynitride layer 20 on frontside surface 12. Polysilicon layer 24 may be deposited using a chemical vapor deposition (CVD) process.

Figure 8:
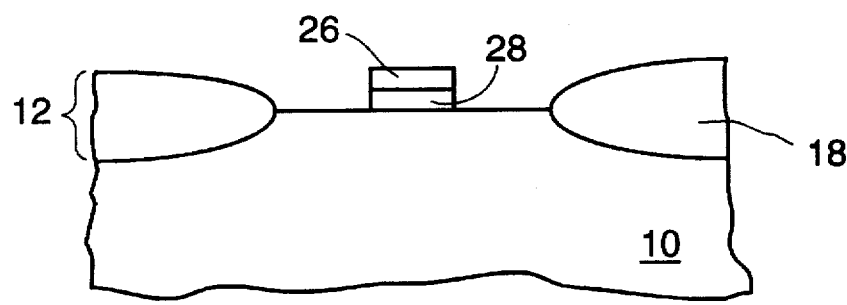
FIG. 8 shows the silicon substrate of FIG. 7 after the polysilicon layer and the oxynitride layer have been patterned to form a polysilicon gate electrode and a gate dielectric, respectively.

FIG. 8 shows silicon substrate 10 after polysilicon layer 24 and oxynitride layer 20 have been selectively etched to form polysilicon gate electrode 26 and gate dielectric 28, respectively. Polysilicon layer 24 and oxynitride layer 20 are patterned by masking the gate structures with polymerized photoresist and etching the exposed portions of polysilicon layer 24 and oxynitride layer 20.

Figure 9:
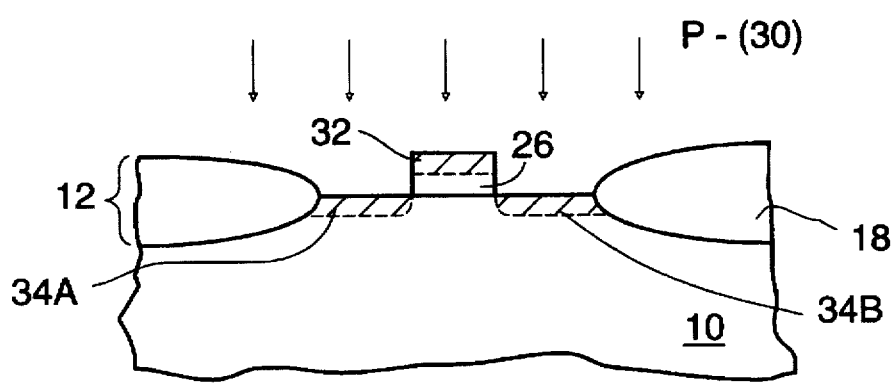
FIG. 9 shows the frontside surface of the silicon substrate of FIG. 8 being subjected to a relatively low concentration of p-type boron ions.

FIG. 9 shows silicon substrate 10 being subjected to a relatively low concentration of p-type boron ions 30. Boron ions penetrate into polysilicon gate electrode 26, forming a lightly-doped boron region 32. Using the well-known self-aligned technique, boron ions also penetrate into silicon substrate 10 at frontside surface 12, forming lightly-doped source-drain regions 34a and 34b. Silicon substrate 10 may be subjected to p-type boron ions using a diffusion or ion implantation process.

Figure 10:
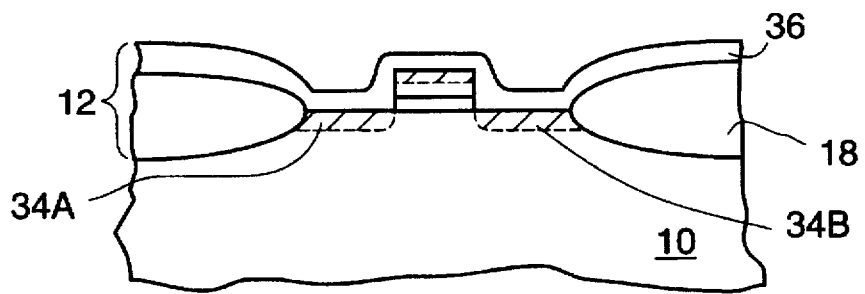
FIG. 10 shows the silicon substrate of FIG. 9 after an oxide layer has been formed over the frontside surface.

FIG. 10 shows silicon substrate 10 after an oxide layer 36 has been formed over frontside surface 12. Oxide layer 36 may be deposited using various CVD techniques.

Figure 11:
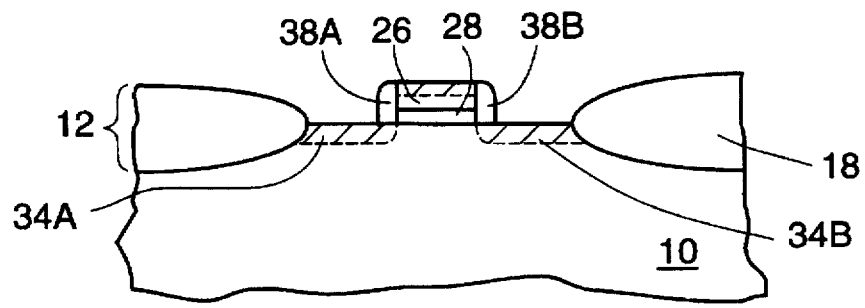
FIG. 11 shows the silicon substrate of FIG. 10 after a majority of the oxide layer over the frontside surface has been etched away, leaving oxide sidewall spacers adjacent to the polysilicon gate electrode and the gate dielectric.

FIG. 11 shows silicon substrate 10 after a majority of oxide layer 36 has been etched away, leaving only oxide sidewall spacers 38a and 38b adjacent to polysilicon gate electrode 26 and gate dielectric 28. Oxide layer 36 may be etched using a directional dry etch process.

Figure 12:
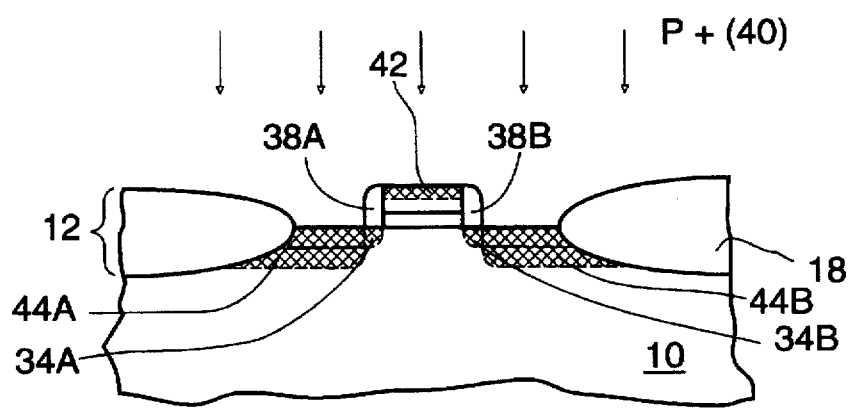
FIG. 12 shows the silicon substrate of FIG. 11 being subjected to a relatively high concentration of p-type boron ions.

FIG. 12 shows silicon substrate 10 being subjected to a relatively high concentration of p-type boron ions 40. Boron ions penetrate into polysilicon gate electrode 26, forming a heavily-doped boron region 42. Boron ions also penetrate into silicon substrate 10 at frontside surface 12, forming heavily-doped source-drain regions 44a and 44b. Oxide sidewall spacers 38a and 38b prevent boron atoms from penetrating into silicon substrate 10 in the regions directly under oxide sidewall spacers 38a and 38b. Silicon substrate 10 may be subjected to p-type boron ions using a diffusion or ion implantation process.

Figure 13:
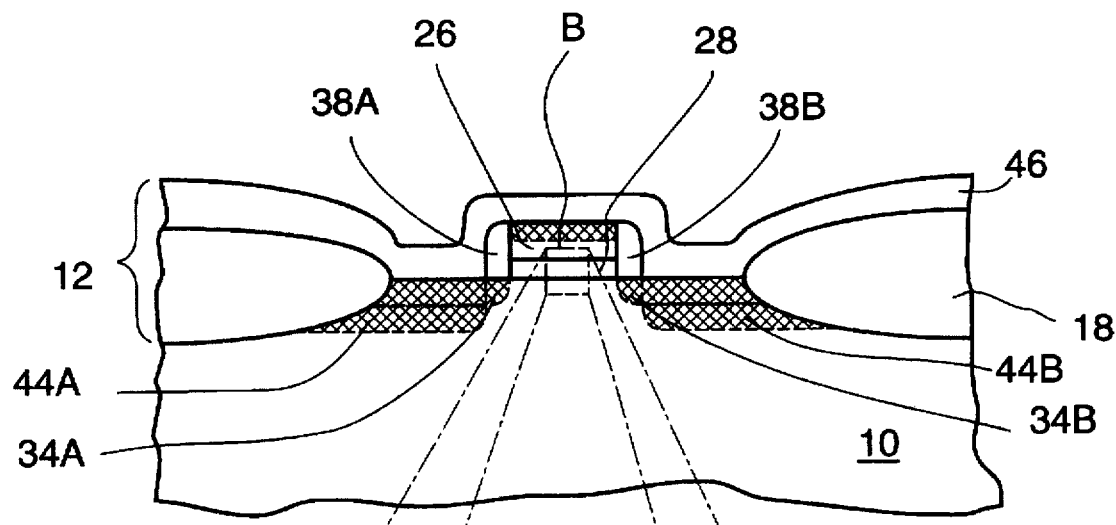
FIG. 13 shows the silicon substrate of FIG. 12 after a passivation layer has been formed over the entire frontside surface.

FIG. 13 shows silicon substrate 10 after a passivation layer 46 has been formed over the entire frontside surface 12 of silicon substrate 10 to seal out contaminants and moisture. The passivation layer is preferably a dielectric such as an oxide which may be selectively removed to allow contact formation between overlying conductors (not shown) and source-drain areas.

Figure 14:
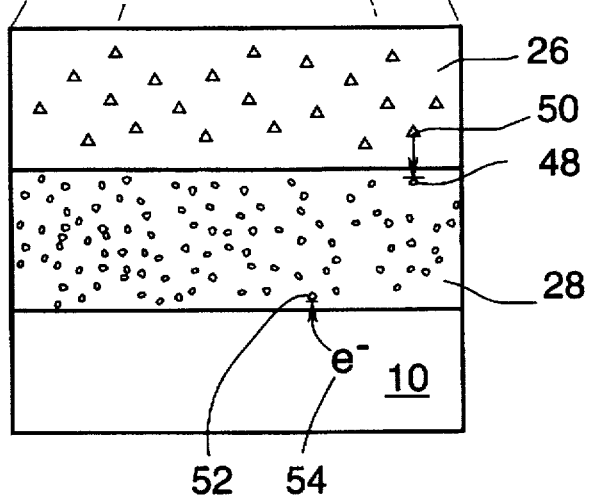
FIG. 14 is a detailed view along plane B of FIG. 13, illustrative of a substantially constant concentration of nitrogen atoms in the gate dielectric used for blockage of boron atoms and/or trapping of hot electrons.

FIG. 14 shows how the fairly uniform concentration of nitrogen atoms in oxynitride dielectric layer 14 of FIG. 13 is capable of 1) preventing boron atoms in polysilicon gate electrode 26 from penetrating into gate dielectric 28, and 2) preventing hot electrons from becoming trapped in gate dielectric 28. A sufficient concentration of nitrogen atoms 48 in gate dielectric 28 near the interface between polysilicon gate electrode 26 and gate dielectric 28 (i.e., the polysilicon-dielectric interface) helps ensure boron atoms 50 in the overlying polysilicon gate electrode 26 are physically blocked by nitrogen atoms 48 in gate dielectric 28 and unable to penetrate into gate dielectric 28. It is postulated that pressure associated with the high pressure chamber makes it thermodynamically favorable for the formation of Si—N bonds in the bulk of oxynitride layer 20, as compared to just at the Si/SiO₂ interface as observed for the formation of oxynitride layers at pressures of 1.0 atmosphere and below. Atomic nitrogen thus forms bonds with silicon and oxygen at uniform intervals within the oxynitride structure. These regular bonds help occupy diffusion avenues normally taken by subsequently introduced boron species within gate dielectric 28 formed from oxynitride layer 20.

Nitrogen atoms and silicon atoms form strong Si—N bonds at the interface between silicon substrate 10 and gate dielectric 28. These bonds are not easily broken by hot electrons injected from the channel region in silicon substrate 10 directly under the polysilicon gate electrode. Thus a sufficient concentration of nitrogen atoms 52 incorporated in gate dielectric 28 near the interface between silicon substrate 10 and gate dielectric 28 (dielectric-substrate interface) helps ensure injected electrons 54 are not easily trapped in gate dielectric 28. It is postulated that fewer hot electrons have sufficient energy to break strong Si—N bonds located near the dielectric-substrate interface, reducing the number of hot electrons becoming trapped at broken bond sites within the dielectric.

It will be appreciated to those skilled in the art after having the benefit of this disclosure that this invention is believed to be capable of applications with any integrated circuit embodied upon a silicon substrate. Furthermore, it is also to be understood that the form of the invention shown and described is to be taken as presently preferred embodiments. Various modifications and changes may be made to each and every processing step as would be obvious to a person skilled in the art having the benefit of this disclosure. It is intended that the following claims be interpreted to embrace all such modifications and change and, accordingly, the specification and drawings are to be regarded in an illustrative rather than a restrictive sense.

What is claimed is:

1. A method of forming a dielectric layer upon a silicon substrate, comprising:

placing the silicon substrate into an ambient containing N₂O and/or NO;

increasing the pressure of said ambient about the silicon substrate to a level of at least 2.0 atmospheres, thereby growing a dielectric layer comprising nitrogen and oxygen upon at least one surface of said silicon substrate.

2. The method as recited in claim 1, wherein the ambient comprises nitrous oxide (N₂O).

3. The method as recited in claim 1, wherein the ambient comprises nitric oxide (NO).

4. The method as recited in claim 1, wherein the ambient comprises both nitrous oxide (N₂O) and nitric oxide (NO).

5. The method as recited in claim 1, further comprising increasing the temperature of said ambient about the silicon substrate to a level between 650° C. and 900° C. prior to placing the silicon substrate into the ambient.

6. The method as recited in claim 1, wherein the pressure of said ambient about the silicon substrate is increased to a level between 2.0 atmospheres and 25.0 atmospheres.

7. A method of forming a p-type MOS transistor at a frontside surface of a silicon substrate, comprising:

placing the silicon substrate into an ambient containing N₂O and/or NO;

increasing the temperature of said ambient about the silicon substrate to a level between 650° C. and 900° C. and increasing the pressure of said ambient about the silicon substrate to a level between 2.0 atmospheres and 25.0 atmospheres, thereby growing a dielectric layer having nitrogen atoms incorporated at substantially periodic intervals throughout a majority of the thickness of said dielectric;

depositing a polysilicon layer upon said dielectric layer;

etching the polysilicon layer and underlying dielectric layer in order to form a polysilicon gate electrode upon a gate dielectric; and doping said polysilicon gate electrode and source-drain regions of the silicon substrate surrounding the polysilicon gate electrode and gate dielectric with boron atoms.

8. The method as recited in claim 7, wherein the comprises nitrous oxide (N₂O).

9. The method as recited in claim 7, wherein the ambient comprises nitric oxide (NO).

10. The method as recited in claim 7, wherein the ambient comprises both nitrous oxide (N₂O) and nitric oxide (NO).

11. The method as recited in claim 7, further comprising increasing the temperature of the ambient about the silicon substrate to a level between 650° C. and 900° C. prior to placing the silicon substrate into the ambient.

12. The method as recited in claim 7, wherein said ambient is substantially void of hydrogen atoms.

13. The method as recited in claim 1, further comprising growing said dielectric layer such that the nitrogen atoms incorporated within said dielectric are at an elevational level near an upper surface of said dielectric.

14. The method as recited in claim 1, further comprising growing a dielectric layer having a peak concentration of nitrogen atoms incorporated within said dielectric at an elevational level near an upper surface and a lower surface of said dielectric proximate to said polysilicon layer and silicon substrate, respectively.

15. The method as recited in claim 1, wherein the pressure within said chamber about the silicon substrate is increased to a level between 2.0 atmospheres and 25.0 atmospheres.

16. The method as recited in claim 7, wherein the nitrogen atoms within said gate dielectric near the interface between the polysilicon gate electrode and the gate dielectric are sufficient to prevent boron atoms in the polysilicon gate electrode from penetrating into the gate dielectric.

17. The method as recited in claim 7, wherein the nitrogen atoms within said gate dielectric near the interface between the gate dielectric and the silicon substrate are sufficient to reduce the number of high-energy electrons injected into the gate dielectric from the silicon substrate which become trapped in the gate dielectric.

18. A method of forming a gate dielectric having enhanced dielectric capacity, comprising:

growing in an ambient pressurized above 2.0 atmospheres an oxynitride film upon an exposed surface of a silicon substrate, wherein oxygen and nitrogen atomic species are substantially uniformly distributed throughout said film along a majority of the thickness;

depositing a polysilicon film upon said oxynitride film;

patterning said polysilicon film and said oxynitride film using a sequential etch process to form a polysilicon gate electrode aligned with a underlying gate dielectric; and exposing the upper and lower surfaces of said gate dielectric to boron atoms originating from respective said polysilicon film and silicon substrate, wherein said nitrogen atomic species within the gate dielectric substantially repels boron atoms from diffusing or injecting thereinto.

* * * * *

UNITED STATES PATENT AND TRADEMARK OFFICE
CERTIFICATE OF CORRECTION

PATENT NO. : 5,674,788

DATED : October 7, 1997

INVENTOR(S) : Dirk J. Wristers; H. Jim Fulford; Dim Lee Kwong

It is certified that error appears in the above-identified patent and that said Letters Patent is hereby corrected as shown below:

In the Claims:

Claim 8, col. 10, lines 12 and 13, please insert "ambient" before "comprises".

Claim 11, col. 10, line 19, please delete "the" before "ambient" and insert "said".

Signed and Sealed this

Thirtieth Day of December, 1997

Attest:

BRUCE LEHMAN

Attesting Officer

Commissioner of Patents and Trademarks